United States Patent
Lin et al.

(10) Patent No.: US 12,051,748 B2
(45) Date of Patent: Jul. 30, 2024

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Hsin-Fu Lin, Hsinchu (TW); Chien-Hung Liu, Hsinchu (TW); Tsung-Hao Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 260 days.

(21) Appl. No.: 17/400,671

(22) Filed: Aug. 12, 2021

(65) Prior Publication Data

US 2023/0049610 A1 Feb. 16, 2023

(51) Int. Cl.
*H01L 29/78* (2006.01)
*H01L 29/06* (2006.01)
*H01L 29/66* (2006.01)

(52) U.S. Cl.
CPC ...... *H01L 29/7816* (2013.01); *H01L 29/0653* (2013.01); *H01L 29/66681* (2013.01)

(58) Field of Classification Search
CPC ........... H01L 29/0653; H01L 29/66659; H01L 29/66681; H01L 29/66689; H01L 29/7816; H01L 29/7835

USPC .......................................................... 257/343
See application file for complete search history.

(56) References Cited

U.S. PATENT DOCUMENTS

| | | | | |
|---|---|---|---|---|
| 2010/0270616 | A1* | 10/2010 | Yanagi | H01L 29/8605 438/689 |
| 2011/0248341 | A1* | 10/2011 | Ring | H01L 29/0653 257/335 |
| 2019/0378925 | A1* | 12/2019 | Shinohara | H01L 29/0878 |

FOREIGN PATENT DOCUMENTS

CN 104576499 * 10/2013 ....... H01L 29/66681

* cited by examiner

*Primary Examiner* — Fazli Erdem

(74) *Attorney, Agent, or Firm* — Birch, Stewart, Kolasch & Birch, LLP

(57) ABSTRACT

A semiconductor device includes a semiconductor layer, a drift region, a source area, a well region, a drain area, and a dielectric film. The drift region and the source area are formed in the semiconductor layer. The well region is formed in the semiconductor layer and between the drift region and the source area. The drain area is formed in the drift region. The dielectric film is formed in the drift region and is located between the source area and the drain area. The dielectric film includes a proximate end portion and a distal end portion which are proximate to and distal from the source area, respectively, and which are asymmetrical to each other.

20 Claims, 13 Drawing Sheets

SEMICONDUCTOR DEVICE AND METHOD FOR MANUFACTURING THE SAME

BACKGROUND

Semiconductor devices, such as bipolar-CMOS (complementary metal oxide semiconductor)-DMOS (double diffused metal oxide semiconductor) (BCD) devices, might experience severe dielectric damages (e.g., due to an excess of hot carriers) during operation. The excess of hot carriers might degrade the electrical performance of the BCD devices or cause malfunction of the BCD devices. Therefore, there is a need to reduce the adverse effect caused by the hot carriers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
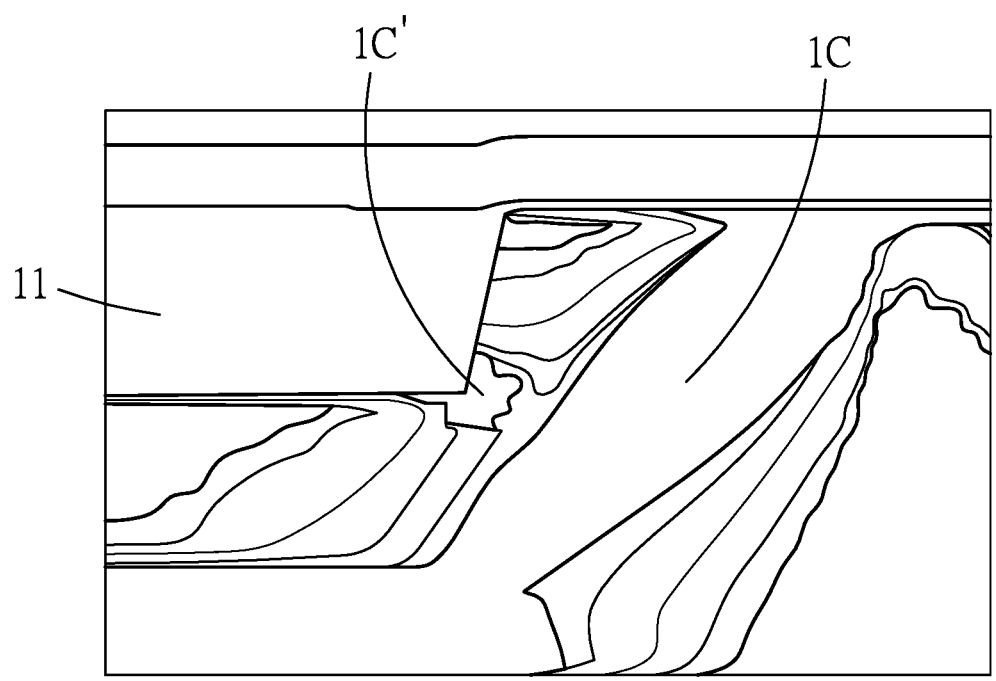
FIG. 1 is a simulation diagram illustrating a hot carrier density contour of a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "upper," "lower," "top," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a semiconductor device (for example, a semiconductor field effect transistor), an on-current may flow from a source area into a drain area during a reading operation. Dielectric damages (e.g., due to an excess of hot carriers) may be generated by impact ionization to accumulate gradually along a travelling direction of the carriers from the source area into the drain area. Such hot carriers may accumulate nearby a bottom and/or sidewalls of a dielectric film (for example, shallow trench isolation (STI) region). The greater the number of the hot carriers, the greater the possibility of the hot carrier being undesirably injected into the dielectric film or other regions of the semiconductor device. FIG. 1 illustrates a two-dimensional simulation model for simulating a flow of an on-current in a semiconductor device during a reading operation. Please note that a dielectric film 11 in the semiconductor device shown in FIG. 1 is partially shown, and the dielectric film 11 has a symmetrical configuration. The simulation result shows two high density zones 1C and 1C' in each of which the density of the hot carriers is relatively high. The high density zone 1C' is formed nearby a bottom and a sidewall of the dielectric film 11, and may cause a severe hot carrier damage to the dielectric film 11, which may degrade reliability of the semiconductor device, induce high leakage current, or even cause malfunction of the semiconductor device. The semiconductor device may be a power metal oxide semiconductor field effect transistor (MOSFET), which may be a bipolar, complementary metal-oxide semiconductor (CMOS), and diffusion metal-oxide semiconductor (DMOS) device (bipolar-CMOS-DMOS (BCD) device), for example, but not limited to, a LDMOS transistor (lateral diffused metal oxide semiconductor field effect transistor) or other suitable transistor/power device.

The present disclosure is directed to a semiconductor device with an enhanced immunity against the dielectric damages (e.g., hot carriers), and methods for manufacturing the same. The semiconductor device may be used in, for example, but not limited to, a 55 nanometer (N55) generation device, a 28 nanometer (N28) generation device, a 20 nanometer (N20) generation device, a 16 nanometer (N16) generation device, or other generation devices.

Figure 2:
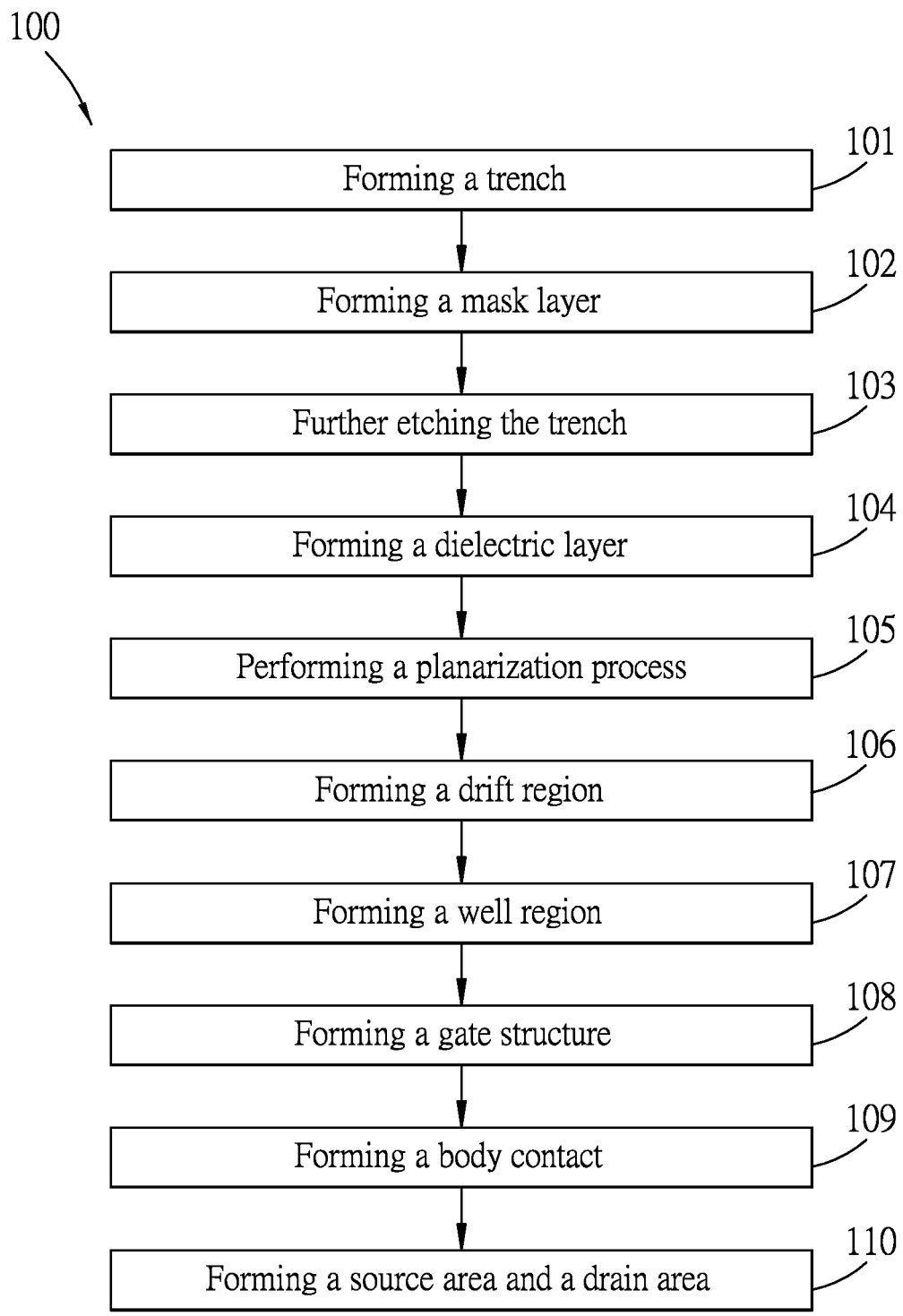
FIG. 2 is a flow diagram illustrating a method for manufacturing a semiconductor device in accordance with some embodiments.

FIG. 2 is a flow diagram illustrating a method 100 for manufacturing a semiconductor device (for example, a semiconductor device 200 shown in FIG. 13) in accordance with some embodiments. FIGS. 3 to 13 illustrate schematic views of the intermediate stages of the method 100. FIG. 14 is a reading of simulation result of the semiconductor device 200.

Figure 3:
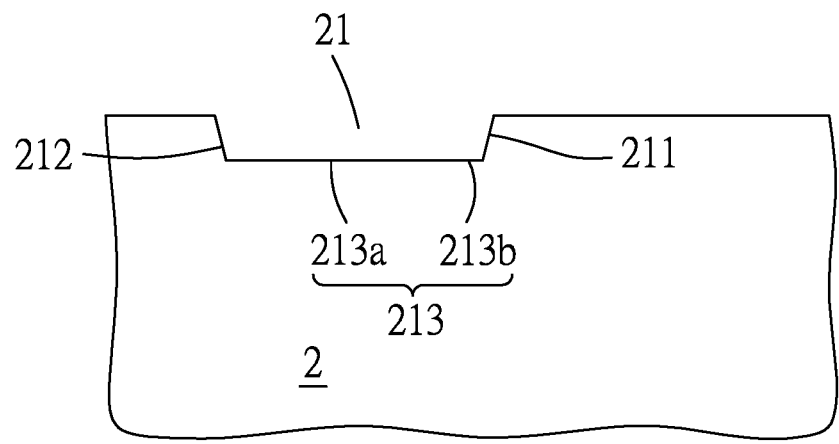
FIGS. 3 to 13 are schematic views illustrating intermediate stages of the manufacturing method in accordance with some embodiments as depicted in FIG. 2.

Referring to FIGS. 2 and 3, the method 100 begins at step 101, where a trench 21 is formed in a semiconductor layer 2. The semiconductor layer 2 may include silicon. Other suitable semiconductor materials for the semiconductor layer 2 are within the contemplated scope of the present disclosure. The trench 21 may be formed using a photolithography process and an etching process. The photolithography process may include, for example, but not limited to, coating a photoresist (not shown), soft-baking, exposing the photoresist through a photomask, post-exposure baking, and developing the photoresist, followed by hard-baking so as to form a patterned photoresist on the semiconductor layer 2. The etching process may be performed by etching the semiconductor layer 2 through the patterned photoresist using, for example, but not limited to, a dry etching process, a wet etching process, other suitable etching processes, or combinations thereof. The trench 21 may include a proximate sidewall 211, a distal sidewall 212 opposite to the proximate sidewall 211, and a trench bottom 213 interconnecting the proximate and distal sidewalls 211, 212. The trench bottom 213 has a first bottom region 213a and a second bottom region 213b which is located between the first bottom region 213a and the proximate sidewall 211.

Figure 4:
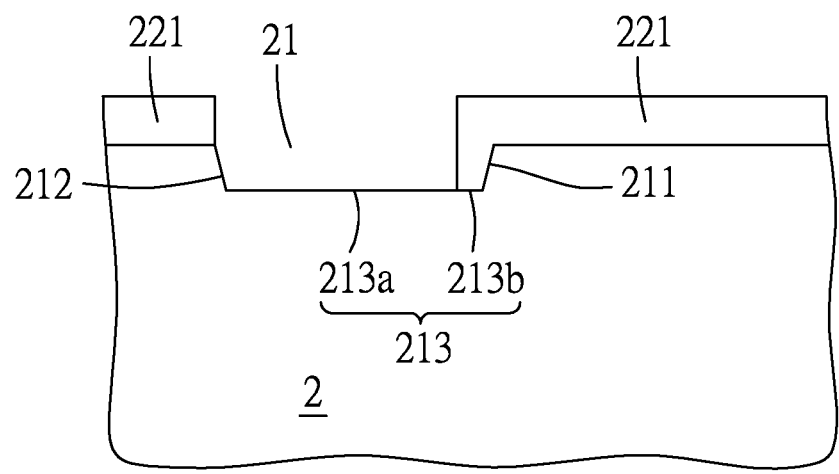

Referring to FIGS. 2 and 4, the method 100 proceeds to step 102, where a mask layer 221 is formed on the semiconductor layer 2 and the trench 21 to cover the second bottom region 213b and the proximate sidewall 211, and to expose the first bottom region 213a and the distal sidewall 212. In some embodiments, the mask layer 221 is a patterned photoresist, and the processes for forming the patterned photoresist are similar to those as described in step 101, and therefore, the details thereof are omitted for the sake of brevity. In an alternative embodiment, the mask layer 221 is a patterned hard mask.

Figure 5:
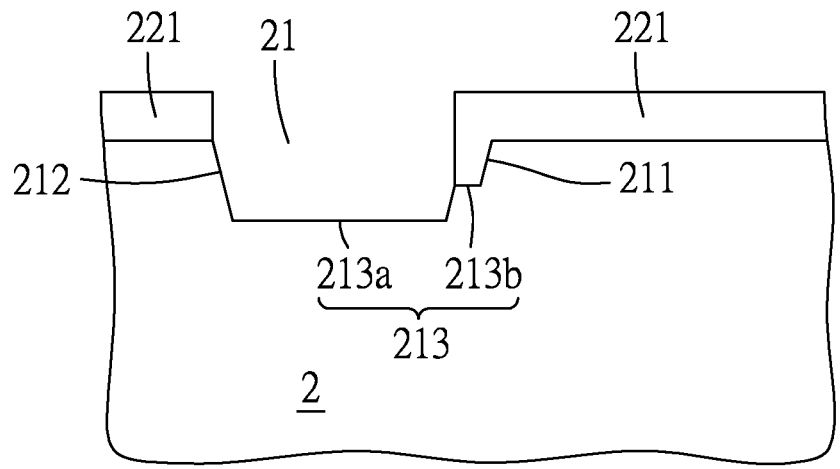

Referring to FIGS. 2 and 5, the method 100 proceeds to step 103, the trench 21 is further deepened by etching the first bottom region 213a and the distal sidewall 212 shown in FIG. 4 such that the deepened trench 21 has an asymmetrical trench profile. In the deepened trench 21, the etched first bottom region 213a has a depth larger than that of the second bottom region 213b. Step 103 may be performed by etching the exposed distal sidewall 212 and the exposed first bottom region 213a through the mask layer 221 using, for example, dry etching, wet etching, other suitable etching processes, or combinations thereof. After the formation of the deepened trench 21, the mask layer 221 may be removed.

Figure 6:
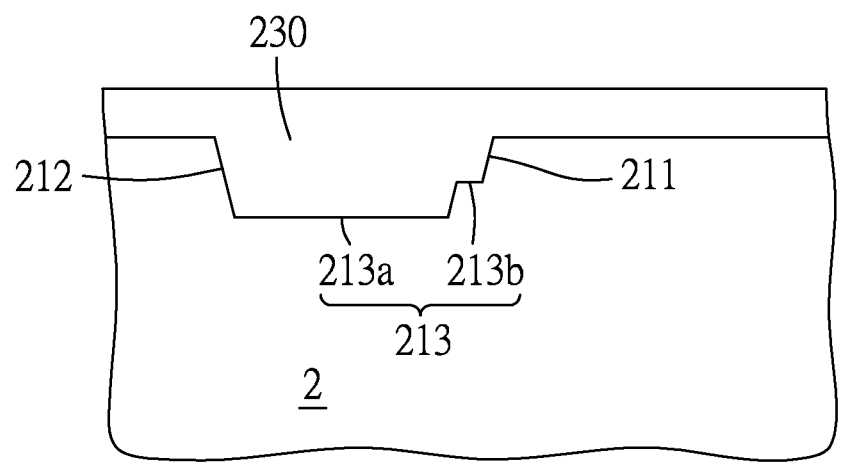

Referring to FIGS. 2 and 6, the method 100 proceeds to step 104, where a dielectric layer 230 is formed on the semiconductor layer 2 to fill the deepened trench 21 shown in FIG. 5. The dielectric layer 230 may include, but not limited to, silicon oxide, silicon nitride, silicon oxynitride, or combinations thereof. Other suitable dielectric materials are within the contemplated scope of the present disclosure. The dielectric layer 230 may be deposited by, for example, but not limited to, chemical vapor deposition (CVD), physical vapor deposition (PVD), or other suitable deposition techniques.

Figure 7:
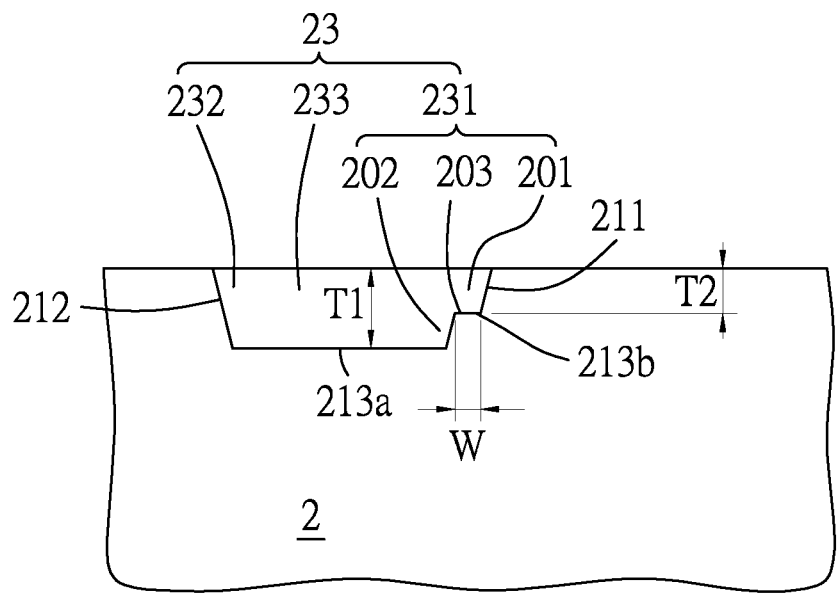

Referring to FIGS. 2 and 7, the method 100 proceeds to step 105, where a planarization process is conducted to remove an excess of the dielectric layer 230 shown in FIG. 6, and to expose the semiconductor layer 2, so as to obtain a dielectric film 23. The dielectric film 23 is a field oxide region, and may also be referred to as a shallow trench isolation (STI) region. Step 105 may be performed using a chemical mechanical polishing (CMP) process or other suitable planarization techniques. Other suitable processes may be used for formation of the dielectric film 23. The dielectric film 23 includes a proximate end portion 231 located on the second bottom region 213b and the proximate sidewall 211, a distal end portion 232 located on the etched distal sidewall 212, and a main portion 233 located between the proximate end portion 231 and the distal end portion 232 and on the etched first bottom region 213a. In some embodiments, the proximate end portion 231 and the distal end portion 232 may have different outer profiles such that the proximate end portion 231 and the distal end portion 232 are asymmetrical to each other. In some embodiments, the proximate end portion 231 may have a step-like outer profile, and includes an upper region 201, a lower region 202, and a shoulder surface 203. The lower region 202 is depressed relative to the upper region 201. The shoulder surface 203 is located between the upper region 201 and the lower region 202. In some embodiments, the main portion 233 may have a thickness (T1) ranging from about 600 Å to about 5000 Å, but other range values are also within the scope of this disclosure. In some embodiments, the upper region 201 may have a thickness (T2) in a range of about one-third to about two-third of the thickness (T1) of the main portion 233, but other range values are also within the scope of this disclosure. In some embodiments, if the thickness (T2) of the upper region 201 is less than about one-third of the thickness (T1) of the main portion 233, the dielectric film 23 may not effectively avoid occurrence of electric current leakage within the semiconductor device 200. In some embodiments, if the thickness (T2) of the upper region 201 is greater than about two-third of the thickness (T1) of the main portion 233, the dielectric film 23 may be damaged by the hot carriers, resulting in poor field isolation capability in a logic area of the semiconductor device 200. In some embodiments, the shoulder surface 203 of the proximate end portion 231 may have a width (W) in a range of about one-third to about an entire thickness (T1) of the main portion 233, but other range values are also within the scope of this disclosure. In some embodiments, if the width (W) of the shoulder surface 203 is less than about one-third of the thickness (T1) of the main portion 233, the dielectric film 23 may be damaged by the hot carriers, resulting in poor field isolation capability in the logic area of the semiconductor device 200.

Figure 8:
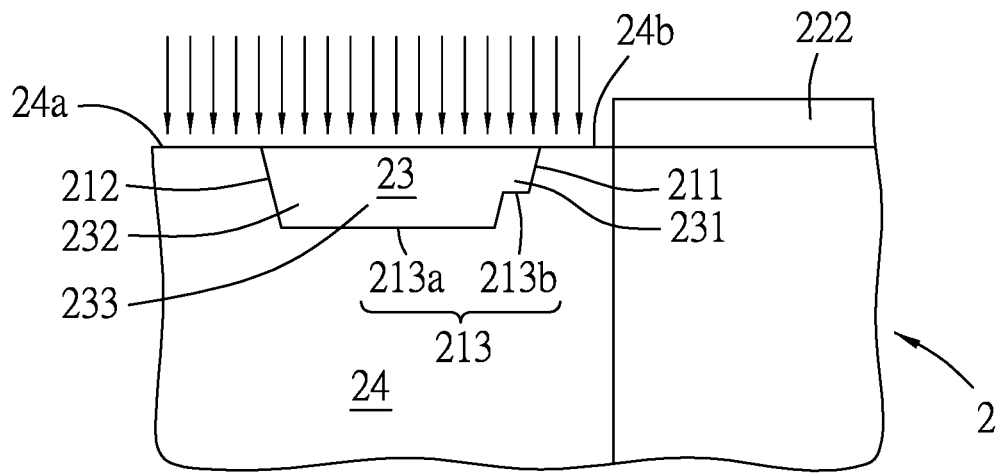

Referring to FIGS. 2 and 8, the method 100 proceeds to step 106, where a drift region 24 is formed in the semiconductor layer 2 such that the dielectric film 23 is located in the drift region 24. Step 106 may be performed by (i) forming a mask layer 222 on the semiconductor layer 2 to expose the dielectric film 23 and a surrounding surface of the semiconductor layer 2 around the dielectric film 23, and (ii) doping the semiconductor layer 2 through the mask layer 222 using, for example, ion implantation process or other suitable processes, so as to form the drift region 24. After step 106, the mask layer 222 may be removed. In some embodiments, the mask layer 222 is a patterned photoresist, and the processes for forming the patterned photoresist are similar to those as described in step 101, and therefore, the details thereof are omitted for the sake of brevity. In an alternative embodiment, the mask layer 222 is a patterned hard mask. In some embodiments, the drift region 24 may have a first type conductivity, and may be formed using an N-type dopant (e.g., P, Sb, or As) for forming an N-type device, or using a P-type dopant (e.g., B, Al, or Ga) for forming a P-type device. In some embodiments, an upper surface of the drift region 24 may have a first surface portion 24a and a second surface portion 24b which are located at two opposite sides of the dielectric film 23. Other suitable processes may be used for formation of the drift region 24.

Figure 9:
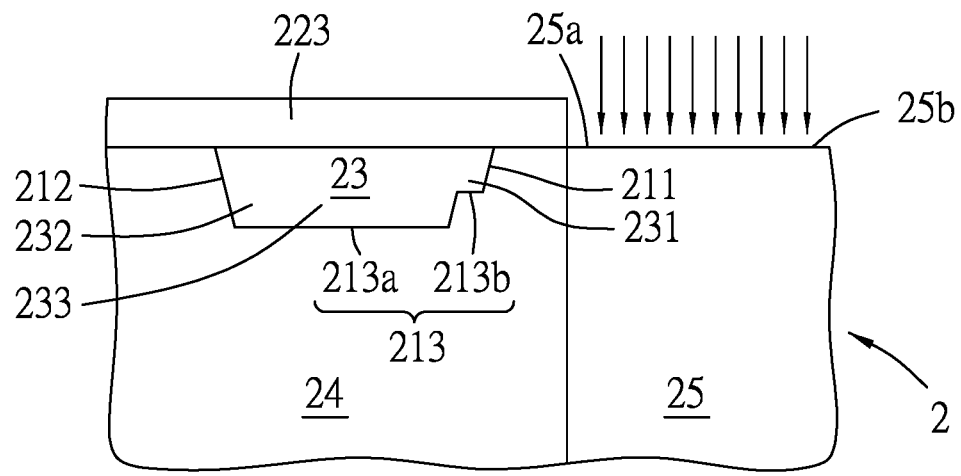

Referring to FIGS. 2 and 9, the method 100 proceeds to step 107, where a well region 25 is formed in the semiconductor layer 2. Step 107 may be performed by (i) forming a mask layer 223 on the semiconductor layer 2 to cover the dielectric film 23 and the drift region 24, and (ii) doping the semiconductor layer 2 through the mask layer 223 using, for example, ion implantation process or other suitable processes, so as to form the well region 25. After step 107, the mask layer 223 may be removed. In some embodiments, the mask layer 223 is a patterned photoresist, and the processes for forming the patterned photoresist are similar to those as described in step 101, and therefore, the details thereof are omitted for the sake of brevity. In an alternative embodiment, the mask layer 223 is a patterned hard mask. In some embodiments, the well region 25 may have a second type conductivity, and may be formed using the abovementioned P-type dopant (e.g., B, Al, or Ga) for forming the N-type device, or using the abovementioned N-type dopant (e.g., P, Sb, or As) for forming the P-type device. In some embodiments, an upper surface of the well region 25 may have a first surface portion 25a and a second surface portion 25b which are proximate to and distal from the dielectric film 23, respectively. Other suitable processes may be used for formation of the well region 25.

Figure 10:
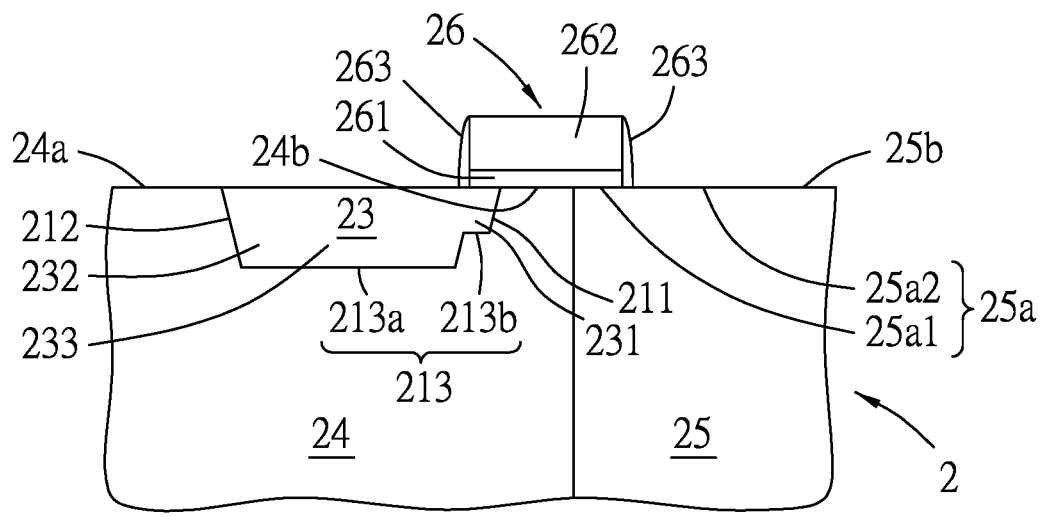

Referring to FIGS. 2 and 10, the method 100 proceeds to step 108, where a gate structure 26 is formed on the semiconductor layer 2. In some embodiments, the gate structure 26 includes a gate dielectric 261 formed on the semiconductor layer 2, a gate electrode 262 formed on the gate dielectric 261, and two gate spacers 263 formed at two opposite sides of a stack of the gate electrode 262 and the gate dielectric 261. In some embodiments, the gate dielectric 261 may include, for example, but not limited to, silicon oxide, silicon oxynitride, silicon nitride, spin-on glass (SOG), fluorinated silica glass (FSG), carbon doped silicon oxide, or combinations thereof. In alternative embodiments, the gate dielectric 261 may include a high-k dielectric material, such as hafnium oxide ($HfO_2$), hafnium silicate (HfSiO), hafnium silicon oxynitride (HfSiON), hafnium tantalate (HfTaO), hafnium titanate (HfTiO), hafnium zirconium oxide (HfZrO), other suitable high-k dielectric materials, or combinations thereof. Other suitable materials for the gate dielectric 261 are within the contemplated scope of the present disclosure. In some embodiments, the gate dielectric 261 may be formed as a single-layer structure, while in other embodiments, the gate dielectric 261 may be formed as a multi-layered structure. The gate electrode 262 may include, for example, but not limited to, a metallic material (e.g., silver, aluminum, copper, tungsten, nickel, other suitable metallic materials, or combinations thereof), a metal compound (e.g., titanium nitride (TiN), tantalum nitride (TaN), metal silicide, other suitable materials, or combinations thereof), polycrystalline silicon, or doped silicon. Other suitable materials for the gate electrode 262 are within the contemplated scope of the present disclosure. In some embodiments, the gate electrode 262 may be formed as a single-layer structure, while in other embodiments, the gate electrode 262 may be formed as a multi-layered structure. The stack of the gate electrode 262 and the gate dielectric 261 may be formed by, for example, a process including (i) sequentially depositing a gate dielectric layer (not shown) and a gate electrode layer (not shown) on the semiconductor layer 2, and (ii) patterning the gate dielectric layer and the gate electrode layer to form the gate dielectric 261 and the gate electrode 262 using a photolithography process and an etching process similar to those described in step 101. In some embodiments, the gate dielectric layer may be deposited on the semiconductor layer 2 using, for example, CVD, PVD, atomic layer deposition (ALD), high density plasma CVD (HDPCVD), metal organic CVD (MOCVD), remote plasma CVD (RPCVD), plasma enhanced CVD (PECVD), plating, or other suitable techniques. In some embodiments, the gate electrode layer may be deposited on the gate dielectric 261 opposite to the semiconductor layer 2 using, for example, CVD, PVD, ALD, HDPCVD, MOCVD, RPCVD, PECVD, plating, or other suitable techniques. The gate spacers 263 may include, for example, but not limited to, silicon oxide, silicon oxynitride, silicon nitride, or combinations thereof. Other suitable materials for the gate spacers 263 are within the contemplated scope of the present disclosure. In some embodiments, each of the gate spacers 263 may be formed as a single-layer structure, while in other embodiments, each of the gate spacers 263 may be formed as a multi-layered structure. The gate spacers 263 may be formed using, for example, CVD, ALD or other suitable techniques to form a gate spacer layer (not shown) over the stack of the gate electrode 262 and the gate dielectric 261, and then anisotropically etching the gate spacer layer to form the gate spacers 263. In some embodiments, the gate structure 26 is formed to cover the proximate end portion 231 of the dielectric film 23, the second surface portion 24b of the drift region 24, and a part 25a1 of the first surface portion 25a of the well region 25. Other suitable processes may be used for forming the gate structure 26.

Figure 11:
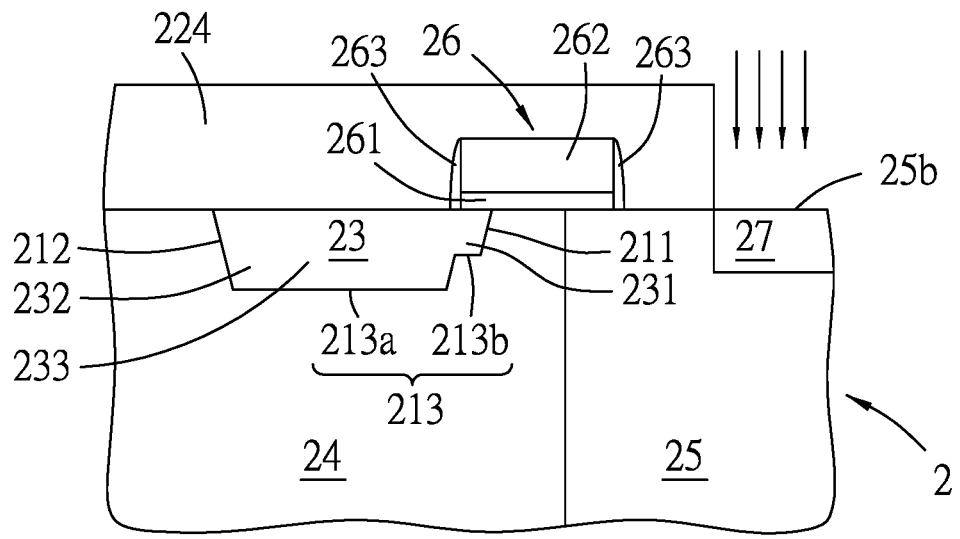

Referring to FIGS. 2 and 11, the method 100 proceeds to step 109, where a body contact 27 is formed in the well region 25. Step 109 may be performed by (i) forming a mask layer 224 on the semiconductor layer 2 to expose the second surface portion 25b of the well region 25, and (ii) doping the well region 25 through the mask layer 224 using ion implantation process or other suitable processes so as to form the body contact 27 within the well region 25. After step 109, the mask layer 224 may be removed. In some embodiments, the mask layer 224 is a patterned photoresist, and the processes for forming the patterned photoresist are similar to those as described in step 101, and therefore, the details thereof are omitted for the sake of brevity. In an alternative embodiment, the mask layer 224 is a patterned hard mask. In some embodiments, the body contact 27 has a second type conductivity, and thus may have a higher doping concentration than that of the well region 25. Therefore, the body contact 27 may be formed using the abovementioned P-type dopant (e.g., B, Al, or Ga) for forming the N-type MOS device, or using the abovementioned N-type dopant (e.g., P, Sb, or As) for forming the P-type MOS device. Other suitable processes may also be used for forming the body contact 27.

Figure 12:
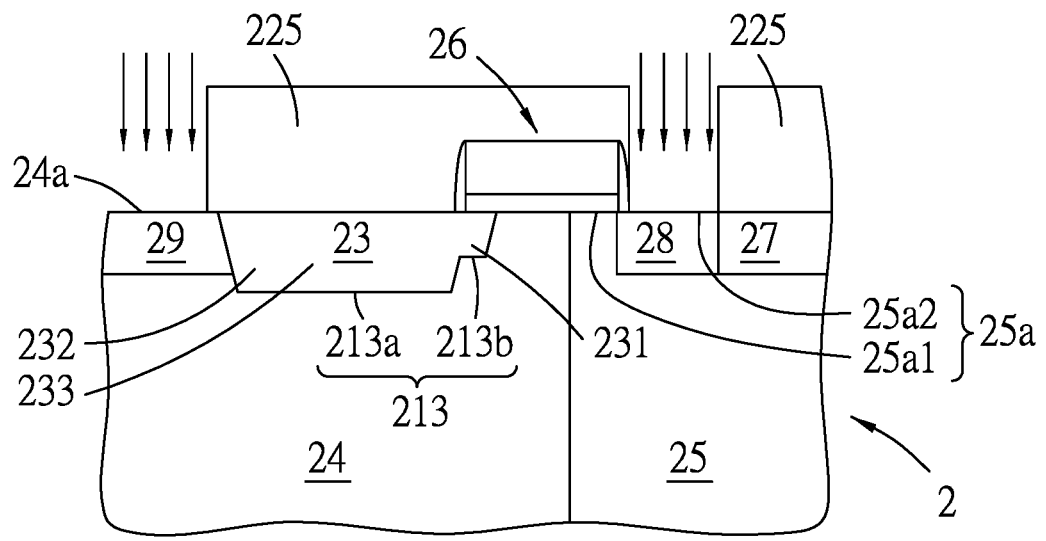

Referring to FIGS. 2 and 12, the method 100 proceeds to step 110, where a source area 28 and a drain area 29 are respectively formed within the well region 25 and the drift region 24. Step 110 may be performed by (i) forming a mask layer 225 on the semiconductor layer 2 to expose a remaining part 25a2 of the first surface portion 25a of the well region 25 and to expose the first surface portion 24a of the drift region 24, and (ii) doping the well region 25 and the drift region 24 through the mask layer 225 using an ion implantation process or other suitable processes so as to form the source area 28 within the well region 25 and the drain area 29 within the drift region 24. After step 110, the mask layer 225 may be removed. In some embodiments, the mask layer 225 is a patterned photoresist, and the processes for forming the patterned photoresist are similar to those of the patterned mask as described in step 101, and therefore, the details thereof are omitted for the sake of brevity. In an alternative embodiment, the mask layer 225 is a patterned hard mask. In some embodiments, each of the source area 28 and the drain area 29 has the first type conductivity, and thus may be formed using the abovementioned N-type dopant (e.g., P, Sb, or As) for forming the N-type MOS device, or using the abovementioned P-type dopant (e.g., B, Al, or Ga) for forming the P-type MOS device. Other suitable processes may also be used for forming the source area 28 and the drain area 29.

Figure 13:
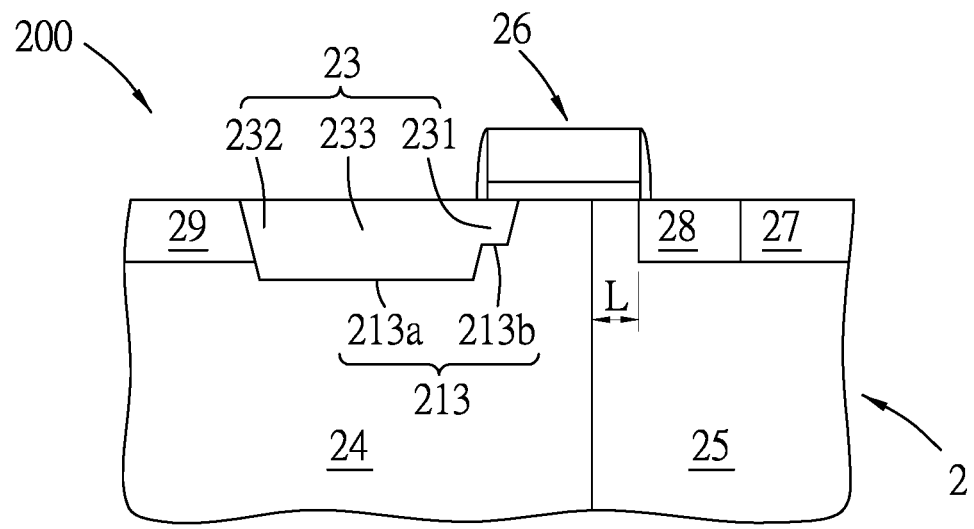
Figure 14:
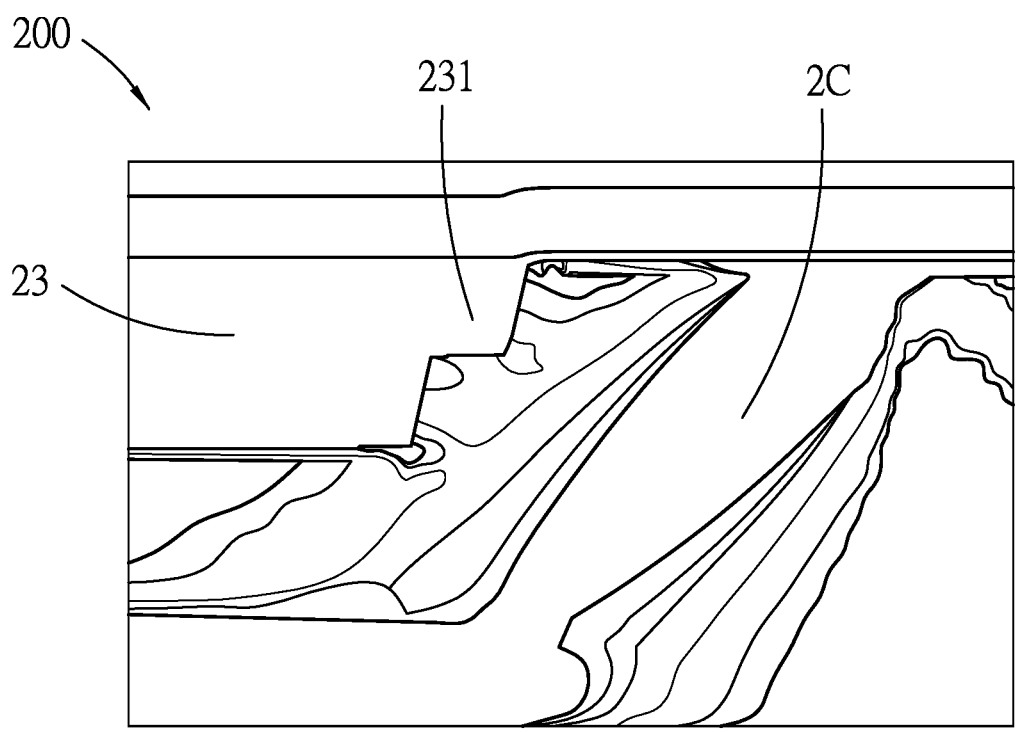
FIG. 14 is a simulation diagram illustrating a hot carrier density contour of the semiconductor device shown in FIG. 13 in accordance with some embodiments.

Referring to FIG. 13, after removing the mask layer 225, the semiconductor device 200 is obtained and a channel length (L) thereof is defined by a distance between the drift region 24 and the source area 28. The dielectric film 23 (for example, STI region) is located between the source area 28 and the drain area 29. The well region 25 is disposed to separate the source area 28 and the body contact 27 from the drift region 24.

In some embodiments, steps 101 to 110 may not be performed in the abovementioned order. In alternative embodiments, other suitable methods may also be applied for forming the semiconductor device 200. In yet alternative embodiments, additional features may be added in the semiconductor device 200, and some features in the semiconductor device 200 may be modified, replaced, or eliminated without departure from the spirit and scope of the present disclosure.

Referring to FIG. 14, in the semiconductor device 200, because of a step-like outer profile of the proximate end portion 231, the dielectric film 23 would be located farther away from a high density zone 2C of the hot carriers to thereby prevent the hot carriers being formed nearby the dielectric film 23 so as to avoid and/or alleviate dielectric damages of the dielectric film 23. As such, the dielectric film 23 may keep good field isolation capability, so as to improve operation performance and reliability of the semiconductor device 200.

Figure 15:
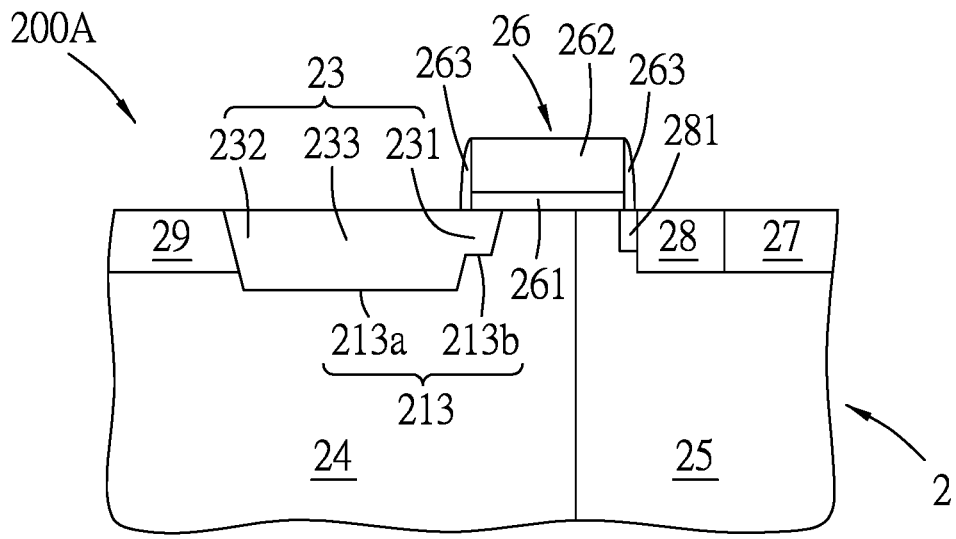
FIG. 15 is a schematic view of a semiconductor device in accordance with some embodiments.

FIG. 15 illustrates a schematic view of a semiconductor device 200A in accordance with some embodiments. The semiconductor device 200A is similar to the semiconductor device 200 except that, a lightly doped region 281 is further included. The semiconductor device 200A may be made using a method 100A similar to the method 100 except for steps 108 and 110.

Figure 16:
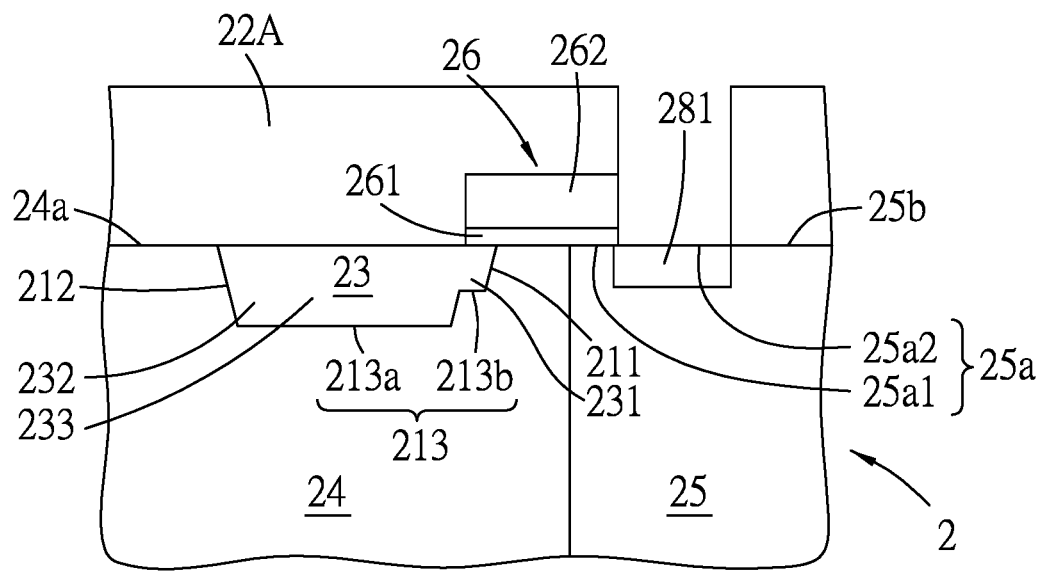
FIGS. 16 to 18 are schematic views illustrating intermediate stages of a method for manufacturing the semiconductor device shown in FIG. 15 in accordance with some embodiments.
Figure 17:
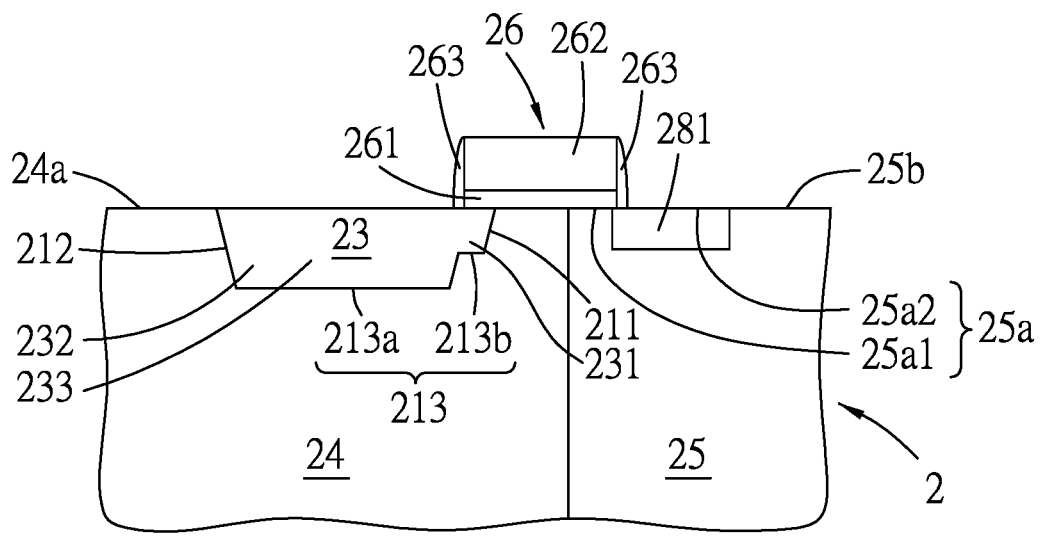

In step 108 of the method 100A, referring to FIG. 16, after forming the stack of the gate electrode 262 and the gate dielectric 261 in a manner similar to that of step 108 of the method 100, the lightly doped region 281 is formed in the well region 25 by (i) forming a mask layer 22A on the semiconductor layer 2 to expose the remaining part 25a2 of the first surface portion 25a of the well region 25, (ii) doping the well region 25 through the mask layer 22A so as to form the lightly doped region 281, and (iii) removing the mask layer 22A. The mask layer 22A may be a patterned photoresist or a patterned hard mask. The lightly doped region 281 has the first type conductivity. Thereafter, referring to FIG. 17, the two gate spacers 263 are formed in a manner similar to that of step 108 of the method 100.

Figure 18:
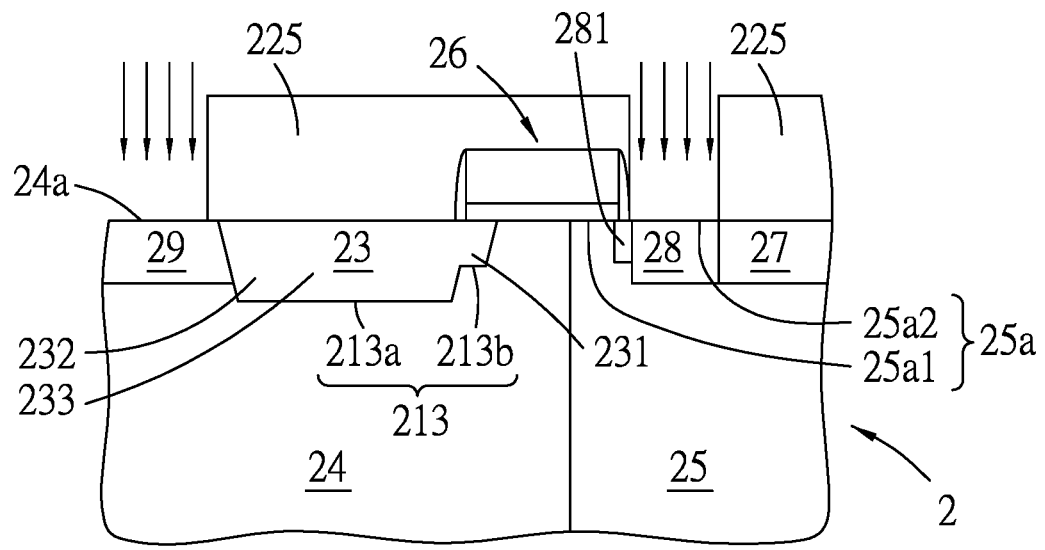

Referring to FIG. 18, step 110 of the method 100A is similar to step 110 of the method 100 except that the source area 28 is formed by doping the lightly doped region 281 exposed from the mask layer 225, and therefore has a higher doping concentration than the lightly doped region 281.

Because the semiconductor device 200A, similar to the semiconductor 200, also has a step-like outer profile of the proximate end portion 231, dielectric damages of the dielectric film 23 due to an excess of hot carriers may also be avoided and/or alleviated, and the semiconductor device 200A may have improved operation performance and reliability.

Figure 19:
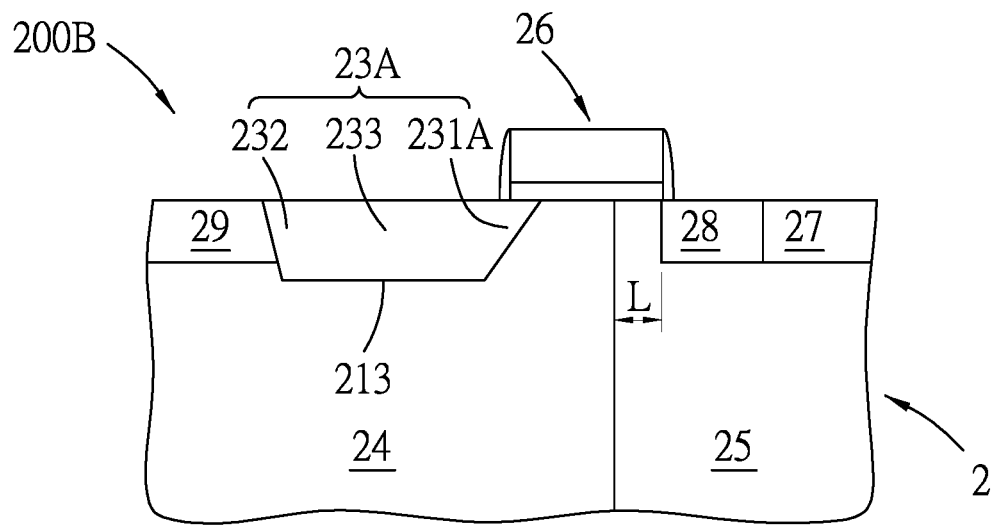
FIG. 19 is a schematic view of a semiconductor device in accordance with some embodiments.
Figure 20:
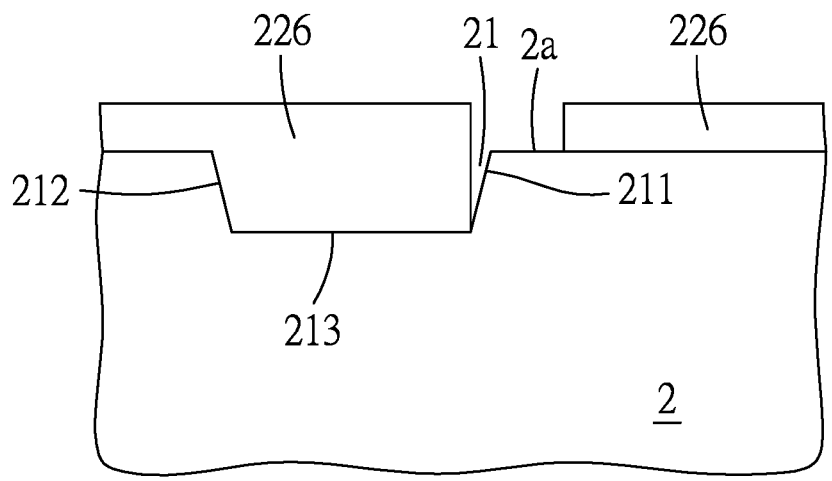
FIGS. 20 to 22 are schematic views illustrating intermediate stages of a method for manufacturing the semiconductor device shown in FIG. 19 in accordance with some embodiments.
Figure 21:
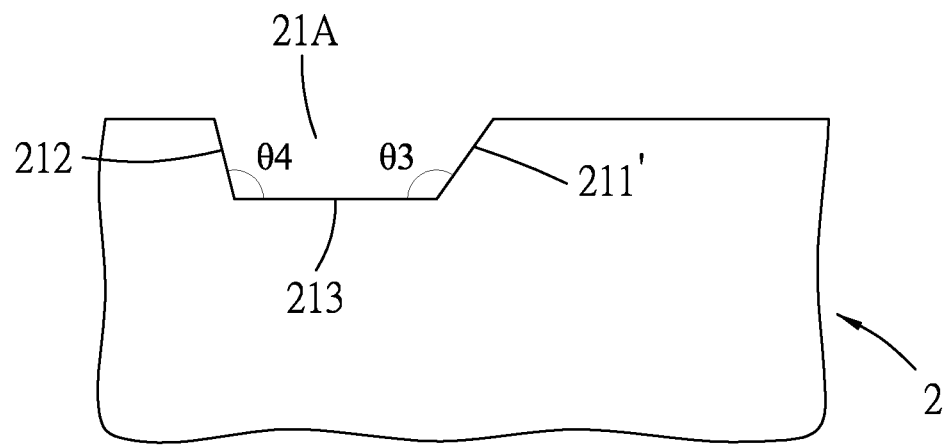
Figure 22:
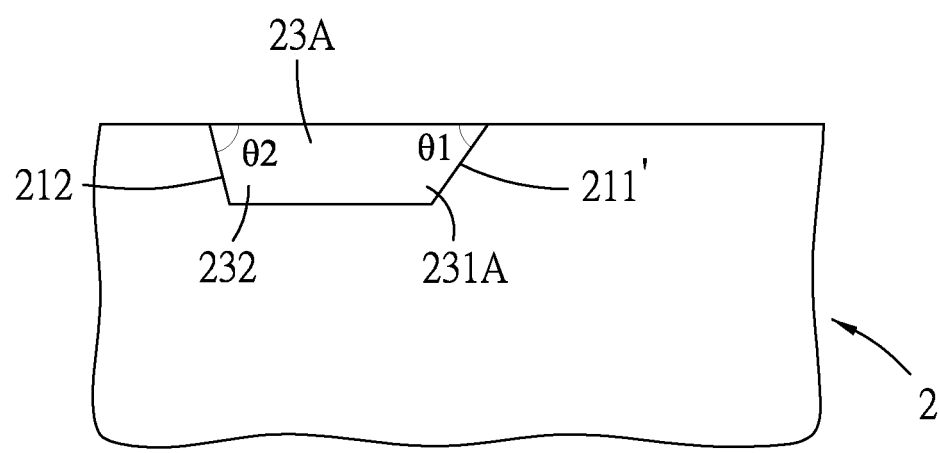
Figure 23:
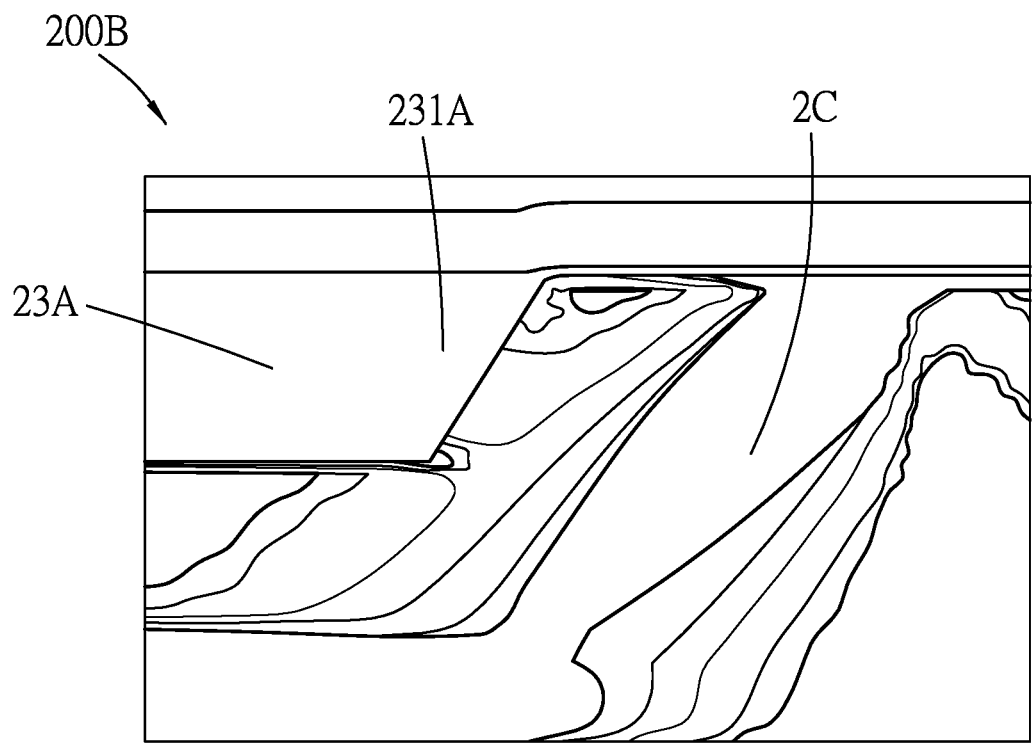
FIG. 23 is a simulation diagram illustrating a hot carrier density contour of the semiconductor device shown in FIG. 19 in accordance with some embodiments.

FIG. 19 illustrates a schematic view of a semiconductor device 200B in accordance with some embodiments. The semiconductor device 200B is similar to the semiconductor device 200 except that, in the semiconductor device 200B, a dielectric film 23A has an asymmetrical cross-sectional shape which is different from that of the dielectric film 23. The semiconductor device 200B may be made using a method 100B similar to the method 100 except for steps 102 to 105. FIGS. 20 to 22 illustrate schematic views of the intermediate stages in steps 102, 103 and 105 of the method 100B. FIG. 23 is a reading of simulation result of the semiconductor device 200B.

Referring to FIG. 20, the method 100B proceeds to step 102, where a mask layer 226 is formed to cover the trench bottom 213, the distal sidewall 212, and the semiconductor layer 2, so as to expose the proximate sidewall 211 and a surface portion 2a of the semiconductor layer 2. In some embodiments, the mask layer 226 is a patterned photoresist, and the processes for forming the patterned photoresist are similar to those as described in step 101, and therefore, the details thereof are omitted for the sake of brevity. In an alternative embodiment, the mask layer 226 is a patterned hard mask.

Referring to FIG. 21, the method 100B proceeds to step 103, where the trench 21 shown in FIG. 20 is further widened by etching the proximate sidewall 211 and the surface portion 2a of the semiconductor layer 2, such that the widened trench 21A has an asymmetrical trench profile. Step 103 may be performed by etching the proximate sidewall 211 and the surface portion 2a of the semiconductor layer 2 through the mask layer 226 shown in FIG. 20 using, for example, dry etching, wet etching, other suitable etching processes, or combinations thereof. After the formation of the widened trench 21A, the mask layer 226 may be removed. In the widened trench 21A, an included angle ($\theta3$) between the etched proximate sidewall 211' and the trench bottom 213 is larger than an included angle ($\theta4$) between the distal sidewall 212 and the trench bottom 213. In some embodiments, the included angles ($\theta3$, $\theta4$) may be arranged to satisfy the range of included angles ($\theta1$, $\theta2$) mentioned hereinafter. For example, the included angle ($\theta4$) may range from about 90 degrees to about 110 degrees, but other range values are also within the scope of this disclosure; and the included angle ($\theta3$) may be not smaller than about 110 degrees, but other range values are also within the scope of this disclosure.

Thereafter, the method 100B proceeds to step 104 where a dielectric layer (not shown) is filled in the widened trench 21A shown in FIG. 21, and referring to FIG. 22, the method 100B sequentially proceeds to step 105, where a planarization process is conducted to remove an excess of the dielectric layer to form a dielectric film 23A. The dielectric film 23A includes a proximate end portion 231A located on the etched proximate sidewall 211', and a distal end portion 232 located on the distal sidewall 212. The materials and processes for forming the dielectric film 23A are similar to those of the dielectric film 23 as described in steps 104 and 105 of the method 100, and therefore, the details thereof are omitted for the sake of brevity. In some embodiments, each of the proximate end portion 231A and the distal end portion 232 of the dielectric film 23A includes a top surface, a bottom surface, and a slanted surface which interconnects the top surface and a bottom surface. In some embodiments, the proximate end portion 231A has a first included angle ($\theta1$) between the top surface and the slanted surface thereof, the distal end portion 232 has a second included angle ($\theta2$) between the top surface and the slanted surface thereof, and the first included angle (θ1) is smaller than the second included angle (θ2). In some embodiments, the second included angle (θ2) may range from about 70 degrees to about 90 degrees, but other range values are also within the scope of this disclosure. In some embodiments, the first included angle (θ1) may be in a range of about one-third to about four-fifth of the second included angle (θ2), but other range values are also within the scope of this disclosure. In some embodiments, if the first included angle (θ1) is smaller than about one-third of the second included angle (θ2), the dielectric film 23A may not effectively avoid occurrence of electric current leakage within the semiconductor device 200B. In some embodiments, if the first included angle (θ1) is larger than about four-fifth of the second included angle (θ2), the dielectric film 23A may be damaged by the hot carriers, resulting in poor field isolation capability in a logic area of the semiconductor device 200B.

In alternative embodiments, other suitable methods may also be applied for forming the semiconductor device 200B. In yet alternative embodiments, additional features may be added in the semiconductor device 200B, and some features in the semiconductor device 200B may be modified, replaced, or eliminated without departure from the spirit and scope of the present disclosure.

Referring to FIG. 23, in the semiconductor device 200B, because of an outer profile of the proximate end portion 231A, the dielectric film 23A would also be farther away from a high density zone 2C of the hot carriers to thereby avoid the hot carriers being formed nearby the dielectric film 23A so as to prevent and/or alleviate dielectric damages. As such, operation performance and reliability of the semiconductor device 200B would be improved.

In an alternative embodiment, the semiconductor device 200B may further include a lightly doped zone 281 which is shown in FIG. 15, and which may be formed using steps 108 and 110 of the method 100A. Therefore, the details for forming the lightly doped region 281 are omitted for the sake of brevity.

In alternative embodiments, in a respective one of the semiconductor devices 200, 200A, 200B, an additional dielectric film (not shown), which also serves as a STI region, may be formed between the source area 28 and the body contact 27 to isolate the source area 28 from the body contact 27.

In the semiconductor device of this disclosure, the dielectric film has the proximate end portion and the distal end portion which are asymmetrical and which have different outer profiles. Therefore, during operation of the semiconductor device, the dielectric damages (due to an excess of the hot carriers) may be less likely to occur, thereby reducing an influence of dielectric damages of the dielectric film on the logic area, and effectively improving electrical performance of the semiconductor device, such as improved reliability, decreased leakage current, and increased device lifetime.

In accordance with some embodiments of the present disclosure, a semiconductor device includes a semiconductor layer, a drift region, a source area, a well region, a drain area, and a dielectric film. The drift region is formed in the semiconductor layer. The source area is formed in the semiconductor layer. The well region is formed in the semiconductor layer and between the drift region and the source area. The drain area is formed in the drift region. The dielectric film is formed in the drift region and is located between the source area and the drain area. The dielectric film includes a proximate end portion and a distal end portion which are proximate to and distal from the source area, respectively, and which are asymmetrical to each other.

In accordance with some embodiments of the present disclosure, the dielectric film has a main portion located between the proximate end portion and the distal end portion, and the proximate end portion and the distal end portion have different outer profiles such that the proximate end portion and the distal end portion are asymmetrical to each other.

In accordance with some embodiments of the present disclosure, the main portion has a thickness ranging from 600 Å to 5000 Å.

In accordance with some embodiments of the present disclosure, the proximate end portion includes an upper region, a lower region, and a shoulder surface. The lower region is depressed relative to the upper region. The shoulder surface is located between the upper region and the lower region. The upper region has a thickness in a range of one-third to two-third of a thickness of the main portion.

In accordance with some embodiments of the present disclosure, the shoulder surface of the proximate end portion has a width in a range of one-third to an entire thickness of the main portion.

In accordance with some embodiments of the present disclosure, each of the proximate end portion and the distal end portion includes a top surface, a bottom surface, and a slanted surface which interconnects the top surface and the bottom surface. The proximate end portion has a first included angle between the top surface and the slanted surface thereof. The distal end portion has a second included angle between the top surface and the slanted surface thereof. The first included angle is smaller than the second included angle.

In accordance with some embodiments of the present disclosure, the second included angle ranges from 70 degrees to 90 degrees.

In accordance with some embodiments of the present disclosure, the first included angle is in a range of one-third to four-fifth of the second included angle.

In accordance with some embodiments of the present disclosure, the semiconductor device further includes a gate structure formed to cover the well region and the proximate end portion of the dielectric film.

In accordance with some embodiments of the present disclosure, the gate structure includes a gate electrode and a gate dielectric located beneath the gate electrode.

In accordance with some embodiments of the present disclosure, the dielectric film serves as a shallow trench isolation (STI) region of the semiconductor device.

In accordance with some embodiments of the present disclosure, each of the drift region, the source area and the drain area has a first type conductivity, and the well region has a second type conductivity opposite to the first type conductivity.

In accordance with some embodiments of the present disclosure, a method for manufacturing a semiconductor device includes: forming a trench in a semiconductor layer, the trench including a proximate sidewall, a distal sidewall opposite to the proximate sidewall, and a trench bottom interconnecting the proximate and distal sidewalls, the trench bottom having a first bottom region and a second bottom region which is located between the first bottom region and the proximate sidewall; further deepening the trench by etching the distal sidewall and a first bottom region such that the etched first bottom region has a depth larger than that of the second bottom region; forming a dielectric film in the deepened trench such that the dielectric film includes a proximate end portion located on the second bottom region and the proximate sidewall, and a distal end portion located on the etched distal sidewall; forming a drift region in the semiconductor layer such that the dielectric film is located in the drift region; forming a well region in the semiconductor layer; forming a source area in the semiconductor layer such that the well region is disposed to separate the source area from the drift region; and forming a drain area in the drift region such that the dielectric film is located between the source area and the drain area.

In accordance with some embodiments of the present disclosure, a method for manufacturing a semiconductor device further includes: forming a mask layer to cover the second bottom region and the proximate sidewall, before further deepening the trench; and removing the mask layer after further deepening the trench.

In accordance with some embodiments of the present disclosure, the proximate end portion has a step-like outer profile.

In accordance with some embodiments of the present disclosure, the depth of the second bottom region is in a range of one-third to two-third of the depth of the etched first bottom region.

In accordance with some embodiments of the present disclosure, a method for manufacturing a semiconductor device includes: forming a trench in a semiconductor layer, the trench including a proximate sidewall, a distal sidewall opposite to the proximate sidewall, and a trench bottom interconnecting the proximate and distal sidewalls; further widening the trench by etching the proximate sidewall such that an included angle between the etched proximate sidewall and the trench bottom is larger than an included angle between the distal sidewall and the trench bottom; forming a dielectric film in the widened trench such that the dielectric film includes a proximate end portion located on the etched proximate sidewall, and a distal end portion located on the distal sidewall; forming a drift region in the semiconductor layer such that the dielectric film is located in the drift region; forming a well region in the semiconductor layer; forming a source area in the semiconductor layer such that the well region is disposed to separate the source area from the drift region; and forming a drain area in the drift region such that the dielectric film is located between the source area and the drain area.

In accordance with some embodiments of the present disclosure, a method for manufacturing a semiconductor device further includes: forming a mask layer to cover the trench bottom and the distal sidewall, before further widening the trench; and removing the mask layer after further widening the trench.

In accordance with some embodiments of the present disclosure, each of the proximate end portion and the distal end portion includes a top surface, a bottom surface, and a slanted surface which interconnects the top surface and the bottom surface. The proximate end portion has a first included angle between the top surface and the slanted surface thereof. The distal end portion has a second included angle between the top surface and the slanted surface thereof. The first included angle is smaller than the second included angle. The second included angle ranges from 70 degrees to 90 degrees.

In accordance with some embodiments of the present disclosure, the first included angle is in a range of one-third to four-fifth of the second included angle.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a trench in a semiconductor layer, the trench including a proximate sidewall, a distal sidewall opposite to the proximate sidewall, and a trench bottom interconnecting the proximate and distal sidewalls, the semiconductor layer having an upper surface which is located outside of the trench, and which includes a first surface portion connected to the distal sidewall, and a second surface portion connected to the proximate sidewall;
    forming a mask layer to cover the trench bottom, the distal sidewall and the first surface portion of the semiconductor layer so that the proximate sidewall and the second surface portion of the semiconductor layer are exposed from the mask layer;
    after forming the mask layer, further widening the trench by etching the proximate sidewall and the second surface portion of the semiconductor layer through the mask layer such that an included angle between the etched proximate sidewall and the trench bottom is larger than an included angle between the distal sidewall and the trench bottom;
    forming a dielectric film in the widened trench such that the dielectric film includes a proximate end portion located on the etched proximate sidewall, and a distal end portion located on the distal sidewall;
    forming a drift region in the semiconductor layer such that the dielectric film is located in the drift region;
    forming a well region in the semiconductor layer;
    forming a source area in the semiconductor layer such that the well region is disposed to separate the source area from the drift region; and
    forming a drain area in the drift region such that the dielectric film is located between the source area and the drain area,
    wherein the dielectric film is formed before forming the drift region and the well region.

2. The method of claim 1, further comprising:
    removing the mask layer after further widening the trench.

3. The method of claim 1, wherein each of the proximate end portion and the distal end portion includes a top surface, a bottom surface, and a slanted surface which interconnects the top surface and the bottom surface, the proximate end portion having a first included angle between the top surface and the slanted surface thereof, the distal end portion having a second included angle between the top surface and the slanted surface thereof, the first included angle being smaller than the second included angle, the second included angle ranging from 70 degrees to 90 degrees.

4. The method of claim 3, wherein the first included angle is in a range of one-third to four-fifth of the second included angle.

5. A method for manufacturing a semiconductor device comprising:
  forming a trench in a semiconductor layer;
  forming a dielectric film in the trench;
  forming a drift region in the semiconductor layer such that the dielectric film is located in the drift region;
  forming a source area in the semiconductor layer such that the drift region and the source area are spaced from each other;
  forming a well region in the semiconductor layer, the well region being located between the drift region and the source area; and
  forming a drain area in the drift region,
  the dielectric film being located between the source area and the drain area, and including a proximate end portion and a distal end portion which are proximate to and distal from the source area, respectively, and which are asymmetrical to each other,
  wherein the dielectric film is formed before forming the drift region and the well region, and
  wherein formation of the trench includes:
  patterning the semiconductor layer to form a preliminary trench which includes a proximate sidewall, a distal sidewall opposite to the proximate sidewall, and a trench bottom interconnecting the proximate sidewall and the distal sidewall, the semiconductor layer having a surface portion which is located outside of the preliminary trench, and which is connected to the proximate sidewall;
  forming a mask layer to cover the trench bottom, the distal sidewall and the first surface portion of the semiconductor layer so that the proximate sidewall and the surface portion of the semiconductor layer are exposed from the mask layer;
  after forming the mask layer, further widening the preliminary trench by etching the proximate sidewall and the surface portion of the semiconductor layer through the mask layer so as to obtain the trench; and
  removing the mask layer after further widening the preliminary trench.

6. The method of claim 5, wherein
  the dielectric film further has a main portion such that the proximate end portion and the distal end portion are spaced apart from each other by the main portion in a first direction,
  the main portion has a thickness in a second direction transverse to the first direction, and
  the proximate end portion and the distal end portion have different outer profiles.

7. The method of claim 6, wherein the thickness of the main portion ranges from 600 Å to 5000 Å.

8. The method of claim 5, wherein each of the proximate end portion and the distal end portion includes a top surface, a bottom surface, and a slanted surface which interconnects the top surface and the bottom surface, the proximate end portion having a first included angle between the top surface and the slanted surface thereof, the distal end portion having a second included angle between the top surface and the slanted surface thereof, the first included angle being smaller than the second included angle.

9. The method of claim 8, wherein the second included angle ranges from 70 degrees to 90 degrees.

10. The method of claim 9, wherein the first included angle is in a range of one-third to four-fifth of the second included angle.

11. The method of claim 5, further comprising
  forming a gate structure to cover the well region and the proximate end portion of the dielectric film.

12. The method of claim 11, wherein the gate structure includes a gate electrode and a gate dielectric located beneath the gate electrode.

13. The method of claim 8, wherein each of the first included angle and the second included angle is an acute angle.

14. A method for manufacturing a semiconductor device, comprising:
  forming a trench in a semiconductor layer, the trench including a proximate sidewall, a distal sidewall opposite to the proximate sidewall, and a trench bottom interconnecting the proximate and distal sidewalls;
  forming a mask layer to cover the trench bottom and the distal sidewall so that at least half of volume of the trench is filled by the mask layer, leaving the proximate sidewall and a surface portion of the semiconductor layer being exposed from the mask layer, the surface portion of the semiconductor layer being located outside of the trench and being connected to the proximate sidewall;
  after forming the mask layer, further widening the trench by etching the proximate sidewall and the surface portion of the semiconductor layer through the mask layer such that an included angle between the etched proximate sidewall and the trench bottom is larger than an included angle between the distal sidewall and the trench bottom;
  forming a dielectric film in the widened trench such that the dielectric film includes a proximate end portion located on the etched proximate sidewall, and a distal end portion located on the distal sidewall;
  forming a drift region in the semiconductor layer such that the dielectric film is located in the drift region;
  forming a well region in the semiconductor layer;
  forming a source area in the semiconductor layer such that the well region is disposed to separate the source area from the drift region; and
  forming a drain area in the drift region such that the dielectric film is located between the source area and the drain area.

15. The method of claim 14, wherein
  the dielectric film further has a main portion such that the proximate end portion and the distal end portion are spaced apart from each other by the main portion in a first direction,
  the main portion has a thickness in a second direction transverse to the first direction, and
  the proximate end portion and the distal end portion have different outer profiles.

16. The method of claim 15, wherein the thickness of the main portion ranges from 600 Å to 5000 Å.

17. The method of claim 14, wherein:
  each of the proximate end portion and the distal end portion includes a top surface, a bottom surface, and a slanted surface which interconnects the top surface and the bottom surface;
  the top surface and the slanted surface of the proximate end portion defines therebetween a first included angle;
  the top surface and the slanted surface of the distal end portion defines therebetween a second included angle; and
  the first included angle is smaller than the second included angle.

18. The method of claim 17, wherein the first included angle is in a range of one-third to four-fifth of the second included angle.

19. The method of claim 14, further comprising
    forming a gate structure to cover the well region and the proximate end portion of the dielectric film.

20. The method of claim 19, wherein the gate structure includes a gate electrode and a gate dielectric located beneath the gate electrode.

\* \* \* \* \*